United States Patent
Brankner et al.

(10) Patent No.: US 6,573,194 B2
(45) Date of Patent: Jun. 3, 2003

(54) METHOD OF GROWING SURFACE ALUMINUM NITRIDE ON ALUMINUM FILMS WITH LOW ENERGY BARRIER

(75) Inventors: Keith J. Brankner, Richardson, TX (US); Wei-Yan Shih, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/921,225

(22) Filed: Aug. 2, 2001

(65) Prior Publication Data

US 2002/0009885 A1 Jan. 24, 2002

Related U.S. Application Data

(60) Provisional application No. 60/226,107, filed on Aug. 17, 2000, provisional application No. 60/167,790, filed on Nov. 29, 1999, provisional application No. 60/167,833, filed on Nov. 29, 1999, and provisional application No. 60/167,783, filed on Nov. 29, 1999.

(51) Int. Cl.$^7$ .............................................. H01L 21/31
(52) U.S. Cl. ...................... 438/775; 438/584; 438/604; 438/643; 438/762
(58) Field of Search ................................ 438/584, 604, 438/643, 762, 775

(56) References Cited

FOREIGN PATENT DOCUMENTS

JP          2001-168101 A   *  6/2001   ....... H01L/21/3205

OTHER PUBLICATIONS

English (machine) translation of JP–2001–168101 A, Blankner et al., "Method for forming Aluminum nitride barrier".*

Abstract of: Zhang et al., "Heteroepitaxy of AlN on lapha Al2O3 by ECR PAVD at low temperatures", Journal of Crystal Growth, 9/93.*

Abstract of: Hirose et al., "Development of AlN substrate for high frequency devices", Proceedings of 1995 Japan Intl. Electronic Manufacturing Technology Sympsoium, 12/95.*

* cited by examiner

*Primary Examiner*—Kamand Cuneo
*Assistant Examiner*—Lisa Kilday
(74) *Attorney, Agent, or Firm*—Jacqueline J. Garner; W. James Brady, III; Frederick J. Telecky, Jr.

(57) ABSTRACT

An integrated circuit having an interconnect layer (104) that comprises a first barrier layer (106) and an aluminum-based layer (108) overlying the first barrier layer (106). An aluminum-nitride layer (112) is located on the surface of the aluminum-based layer (108). AlN layer (112) is formed by converting a native aluminum-oxide layer to AlN using a plasma with $H_2$ and $N_2$ supplied independently rather than supplied together in the form of ammonia.

9 Claims, 1 Drawing Sheet

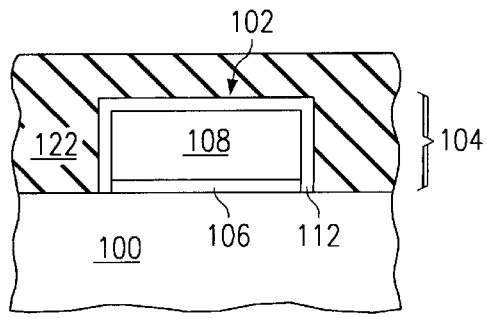
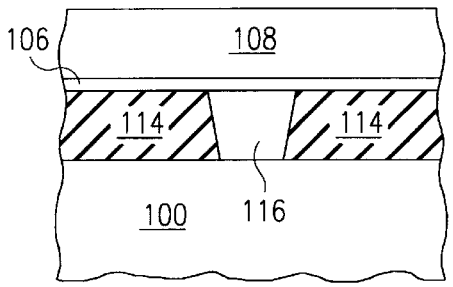
FIG. 1
FIG. 2A
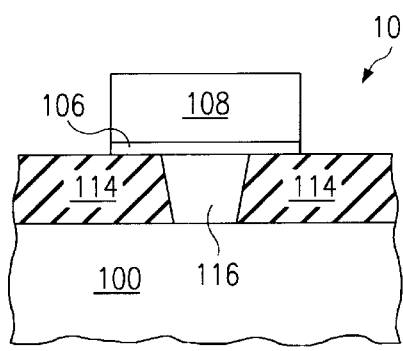
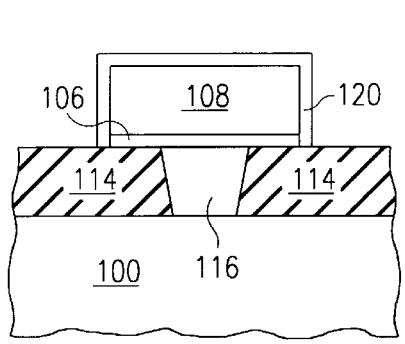
FIG. 2B
FIG. 2C
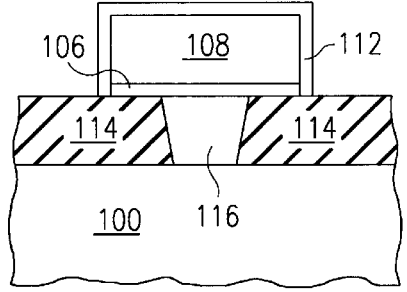
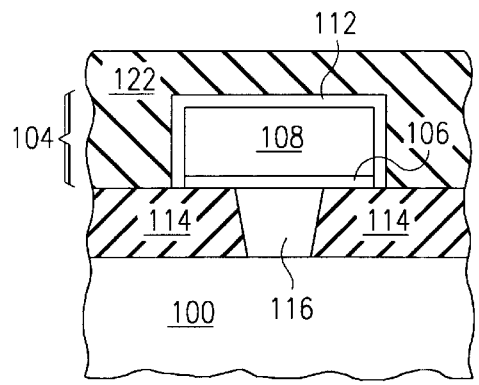
FIG. 2D
FIG. 2E
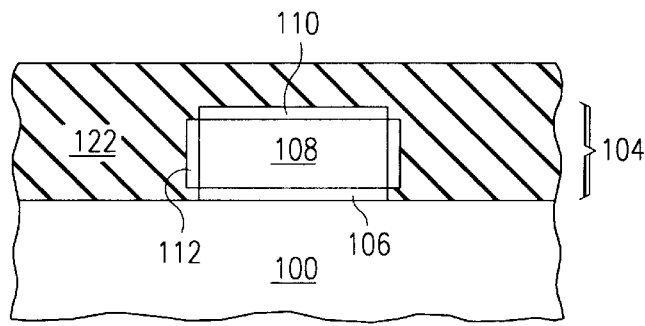
FIG. 3

METHOD OF GROWING SURFACE ALUMINUM NITRIDE ON ALUMINUM FILMS WITH LOW ENERGY BARRIER

CROSS-REFERENCE TO RELATED APPLICATIONS

This application claims priority under 35 USC §119(e)(1) of provisional application No. 60/226,107 filed Aug. 17, 2000.

The following co-pending application is related and hereby incorporated by reference:

| Serial No. | Filing Date | Inventors |
|---|---|---|
| 60/167,790 | 11/29/1999 | Luttmer et at. |
| 60/167,833 | 11/29/1999 | Brankner et at. |
| 60/167,783 | 11/28/1999 | Taylor et at. |

FIELD OF THE INVENTION

The invention is generally related to the field of interconnect layers in semiconductor devices and more specifically to aluminum interconnect layers.

BACKGROUND OF THE INVENTION

As the density of semiconductor devices increases, the demands on interconnect layers for connecting the semiconductor devices to each other also increases. In a conventional interconnect process, the aluminum (and any barrier metals) are deposited, patterned, and etched to form the interconnect lines. A thick oxide liner is then deposited over the interconnect lines to eliminate metal line corrosion and line-to-line leakage when spin-on low-k dielectrics or vapor deposited dielectrics are used between metal lines. These deposited oxide liners are typically on the order of 300 Å thick. This thickness is needed to ensure the required barrier protection.

After the oxide liner is deposited, an interlevel dielectric (ILD) is formed between the interconnect lines. In order to meet the performance demands (i.e., reduced capacitance) of the interconnect lines, spin-on low dielectric constant (low-k) materials and vapor deposited dielectrics are being employed in at least some portion of the ILD. Low-k materials are generally defined as those materials having a dielectric constant below that of silicon dioxide.

There is a desire to decrease the spacing between interconnect lines as the semiconductor devices become denser. The deposited diffusion barrier on the sidewalls of the aluminum interconnect lines further reduces the spacing between interconnect lines. This, in turn, reduces the amount of low-k material that can be used for gap fill between the interconnect lines.

SUMMARY OF THE INVENTION

The invention is an aluminum interconnect line having an aluminum nitride surface layer. After the aluminum is deposited, a native aluminum oxide will typically form on the surface. An aluminum nitride surface layer is formed by converting the native aluminum oxide to aluminum nitride by using independent nitrogen and hydrogen flows in a plasma. Independent nitrogen and hydrogen flows reduce the energy barrier compared to an ammonia plasma chemistry. In addition, the ability to separately adjust the nitrogen and hydrogen flow rates provides more control over the reaction kinetics and energetics.

These and other advantages will be apparent to those of ordinary skill in the art having reference to the specification in conjunction with the drawings.

BRIEF DESCRIPTION OF THE DRAWINGS

In the drawings:

FIG. 1 is a cross-sectional diagram of an interconnect layer according to the invention;

FIGS. 2A–2E are cross-sectional diagrams of the interconnect layer of FIG. 1 at various stages of fabrication; and FIG. 3 is a cross-sectional diagram of an interconnect layer according to the invention having an optional overlying barrier layer.

DETAILED DESCRIPTION OF THE EMBODIMENTS

The invention will now be described in conjunction with an aluminum metal interconnect layer for an integrated circuit. It will be apparent to those of ordinary skill in the art that the invention may be applied to other structures in which it is desired to form a thin barrier over an aluminum film.

An interconnect line 102 according to an embodiment of the invention is shown in FIG. 1. Interconnect line 102 is formed on a semiconductor body 100. As is known in the art, semiconductor body 100 may comprise a substrate with transistors and other devices formed therein. Interconnect line 102 may be part of the first or any subsequent interconnect layer. Interconnect layer 104 comprises a plurality of interconnect lines 102.

Each interconnect line 102 comprises one or more underlying barrier layers 106. In a preferred embodiment of the invention, barrier layer 106 comprises a Ti/TiN stack. Many other barrier layers and combinations of barrier layers are known in the art and may be used in conjunction with the invention. The thickness of barrier layer 106 may vary depending on the process technology and equipment employed. As an example, the thickness may be less than 1500 Å.

Each interconnect line 102 also comprises an aluminum-based metal 108 over the barrier layer 106. For example, Al alloys such as Al—Cu alloys may be used. Suitable aluminum-based metals are also well known in the art. The thickness of metal 108 may vary depending on the process technology and equipment employed. As an example, the thickness may be on the order of 5000 Å.

On the surface (including sidewalls) of interconnect line 102 is a thin AlN layer 112. AlN layer 112 has a thickness on the order of 100 Å. This is significantly thinner than prior art sidewall diffusion barriers. Prior art sidewall diffusion barriers typically needed to be on the order of 300 Å thick to provide the required barrier protection. However, AlN layer 112 provides the required barrier protection even when only 100 Å thick because it is significantly denser than deposited diffusion barriers.

Prior art metal interconnects lines typically comprise a top barrier layer, such as TiN. However, the AlN layer 112 of the invention allows the top barrier layer to be eliminated if desired. AlN layer 112 is only formed over exposed aluminum. Therefore, if an optional top barrier 110 is used, AlN layer 112 will only be formed on the sidewalls of metal lines 108, as shown in FIG. 3.

A method of forming interconnect line 102 will now be discussed with reference to FIGS. 2A–E. Semiconductor body 100 is processed through the formation of interlevel dielectric 114 including the formation of isolation structures (not shown), transistors (not shown) and other devices (also not shown) as is known in the art. Semiconductor body 100 may also have been processed through the formation of one or more interconnect layers. Interlevel dielectric (ILD) 114 may also have via or contact apertures 116 formed therein for connecting interconnect line 102 to transistors, devices, or other interconnect lines.

Referring to FIG. 2A, barrier layer 106 is deposited over ILD 114, including within any exposed apertures 116. Alternatively, apertures 116 may have been filled with, for example, a tungsten plug prior to the deposition of barrier layer 106, as is known in the art. Many suitable barrier layers are known in the art. As an example, barrier layer 106 may comprise a Ti/TiN stack having a thickness less than 1500 Å. A metal 108 is deposited over barrier layer 106, including within aperture 116. Metal 108 comprises an aluminum-based material. For example, an AlCu alloy having a thickness on the order of 5000 Å may be used.

If an overlying barrier layer 110 is desired, as shown in FIG. 3, it may be deposited over metal 108 at this point. Suitable materials for overlying barrier layer 110 are also known in the art. For example, overlying barrier layer 110 may comprise TiN having a thickness of less than 500 Å. Because overlying barrier layer 110 is optional, it is not shown in FIGS. 2A–2E.

Referring to FIG. 2B, metal 108 and barrier layer 106 are patterned and etched to form interconnect lines 102. If included, optional overlying barrier 110 would also be etched at this point. Suitable etches are well known in the art. Standard cleanup processes are then performed.

After the interconnect etch and cleanup, a native oxide 120 forms on the exposed surface of metal 108, as shown in FIG. 2C. Native oxide 120 is an aluminum oxide ($Al_2O_3$). Native oxide 120 forms naturally whenever the metal 108 is exposed to oxygen.

Referring to FIG. 2D, native oxide 120 is converted to AlN layer 112 by using a plasma and independent nitrogen ($N_2$) and hydrogen ($H_2$) sources. Independently supplying $N_2$ and $H_2$ reduces the energy barrier required to convert aluminum oxide to aluminum nitride when compared to ammonia ($NH_3$). $N_2$ and $H_2$ may be supplied simultaneously or $H_2$ may be supplied first to convert the aluminum oxide to aluminum and $H_2O$) and the $N_2$ may be supplied to convert the aluminum to aluminum-nitride.

The reactions for the simultaneous reduction of $Al_2O_3$ and nitridation of Al are as follows:

$$3H_2 + N_2 + Al_2O_3 \leftrightarrow 2AlN + 3H_2O$$

$$\Delta H_f^o = +44 \text{ Kcal/mole } (Al_2O_3)$$

$$\Delta G_f^o = +55 \text{ Kcal/mole}$$

Whereas, the separate reactions for the reduction of $Al_2O_3$ and nitridation of Al are as follows:

$$3H_2 + Al_2O_3 \leftrightarrow 2Al + 3H_2O$$

$$\Delta H_f^o = +196 \text{ Kcal/mole } (Al_2O_3)$$

$$\Delta G_f^o = +205 \text{ Kcal/mole}$$

$$2Al + N_2 \leftrightarrow 2AlN$$

$$\Delta H_f^o = -152 \text{ Kcal/mole } (Al_2O_3)$$

The simultaneous reduction of $Al_2O_3$ and nitridation of Al is more energetically favorable.

Independent control of the $N_2$ and $H_2$ flow rates provides more control over the reaction kinetics and energetics. The $H_2$ flow rate may be independently adjusted to assure complete reduction of $Al_2O_3$. The $N_2$ flow rate may then be independently adjusted to control the nitridation properties (e.g., thickness of AlN layer).

The reduction and nitridation may be performed in a chemical vapor deposition (CVD) plasma chamber or an ash chamber. The resulting AlN layer 112 is be on the order of 100 Å thick.

One exemplary process for forming AlN layer 112 is as follows: Plasma processing in a PECVD chamber using $N_2$ at a flow rate on the order of 2000 sccm, $H_2$ at a flow rate on the order of 2000 sccm, a temperature on the order of 300° C., a pressure on the order of 1.62 torr, and an RF power on the order of 50 watts or more. These process conditions are given by way of example only and are not meant to limit scope of the invention.

After forming AlN layer 112, intrametal dielectric (IMD) 122 is formed between interconnect lines 102, as shown in FIG. 2E. The invention is especially appropriate for IMD layer that comprise, at least in part a low-k dielectric material. The AlN layer 112 formed according to the invention permits direct contact of the low-k dielectric materials on aluminum interconnects with AlN surface layer. Thus, it allows for more of the gapfilling material to be a low-k material. For example, spin-on low-k dielectrics such as FSQ (hydrogen silesquioxane) or CVD based dielectric such as FSG (fluorine doped silicate glass) may be used. However, conventional dielectric materials, such as PSG, BPSG, or TEOS oxides, may also be used.

The above process may be repeated for subsequent metal interconnect layers. The invention may be applied to one or more (or all) of the interconnect layers of an integrated circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming an integrated circuit, comprising the steps of:

converting an aluminum oxide layer to a aluminum nitride layer using a plasma with hydrogen and nitrogen supplied independently.

2. The method of claim 1, further comprising the steps of:

forming a first barrier layer over a semiconductor body;

forming an aluminum-based layer over said first barrier layer;

patterning and etching said first barrier layer and said aluminum-based layer to form an interconnect layer, wherein said aluminum oxide layer is located on a top surface and a sidewall of said interconnect layer.

3. The method of claim 1, wherein said hydrogen and nitrogen are supplied simultaneously.

4. The method of claim 1, wherein said hydrogen is supplied first to reduce said aluminum-oxide to aluminum and nitrogen is supplied thereafter to form aluminum-nitride.

5. The method of claim 1, wherein said aluminum nitride layer is on the order of 100 Å thick.

6. A method of forming an interconnect layer, comprising the steps of:
- forming a first barrier layer over a semiconductor body;
- forming an aluminum-based layer over said first barrier layer;
- patterning and etching said first barrier layer and said aluminum-based layer to form an interconnect layer, wherein an aluminum-oxide layer forms on an exposed surface of said aluminum-based layer;
- subjecting said aluminum-oxide layer to a plasma while supplying $H_2$ from a first source and $N_2$ from a second source, independent from said first source, to reduce said aluminum-oxide layer and create aluminum-nitride.

7. The method of claim 6, wherein said $H_2$ and $N_2$ are supplied simultaneously.

8. The method of claim 6, wherein said $H_2$ is supplied first to reduce said aluminum oxide to aluminum and $N_2$ is supplied thereafter to convert the aluminum to aluminum-nitride.

9. The method of claim 6, wherein said aluminum nitride layer is on the order of 100 Å thick.

* * * * *